United States Patent
Rothwell et al.

(10) Patent No.: US 8,968,583 B2
(45) Date of Patent: Mar. 3, 2015

(54) CLEANING PROCESS FOR MICROELECTRONIC DIELECTRIC AND METAL STRUCTURES

(75) Inventors: Mary Beth Rothwell, Ridgefield, CT (US); Roy Rongqing Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1081 days.

(21) Appl. No.: 11/782,996

(22) Filed: Jul. 25, 2007

(65) Prior Publication Data

US 2009/0029543 A1   Jan. 29, 2009

(51) Int. Cl.
| | |
|---|---|
| H01L 21/4763 | (2006.01) |
| H01L 21/302 | (2006.01) |
| H01L 21/461 | (2006.01) |
| H01B 13/00 | (2006.01) |
| B44C 1/22 | (2006.01) |
| B23P 15/00 | (2006.01) |
| C03C 25/00 | (2006.01) |
| C23F 1/00 | (2006.01) |
| C03C 15/00 | (2006.01) |
| C03C 25/68 | (2006.01) |
| C25F 3/00 | (2006.01) |
| H01L 21/02 | (2006.01) |
| H01L 21/768 | (2006.01) |

(52) U.S. Cl.
CPC .... *H01L 21/76814* (2013.01); *H01L 21/02074* (2013.01); *H01L 21/02063* (2013.01)
USPC ............. 216/17; 438/631; 438/689; 438/690; 438/691; 216/38; 216/39; 216/83; 216/92; 216/105; 216/106; 216/108

(58) Field of Classification Search
None
See application file for complete search history.

(56) References Cited

U.S. PATENT DOCUMENTS

| | | | |
|---|---|---|---|
| 6,465,358 B1 | 10/2002 | Nashner et al. | |
| 6,551,943 B1 * | 4/2003 | Eissa et al. | 438/718 |
| 6,554,002 B2 | 4/2003 | Wu et al. | |
| 6,562,726 B1 * | 5/2003 | Torek et al. | 438/745 |
| 6,569,777 B1 * | 5/2003 | Hsu et al. | 438/725 |
| 6,730,644 B1 * | 5/2004 | Ishikawa et al. | 510/175 |
| 6,851,432 B2 | 2/2005 | Naghshineh et al. | |
| 7,157,415 B2 | 1/2007 | Peyne et al. | |
| 7,172,976 B2 | 2/2007 | Wu | |
| 2002/0035762 A1 * | 3/2002 | Okuda et al. | 15/77 |
| 2003/0125225 A1 * | 7/2003 | Xu et al. | 510/175 |
| 2005/0014667 A1 * | 1/2005 | Aoyama et al. | 510/175 |
| 2005/0245082 A1 * | 11/2005 | Perng et al. | 438/687 |
| 2006/0063308 A1 * | 3/2006 | Shim | 438/115 |

* cited by examiner

*Primary Examiner* — Shamim Ahmed
*Assistant Examiner* — Stephanie Duclair
(74) *Attorney, Agent, or Firm* — Scully, Scott, Murphy & Presser, P.C.; Daniel P. Morris, Esq.

(57) ABSTRACT

A method for cleaning a dielectric and metal structure within a microelectronic structure uses an oxygen containing plasma treatment, followed by an alcohol treatment, in turn followed by an aqueous organic acid treatment. Another method for cleaning a dielectric and metal structure within a microelectronic structure uses an aqueous surfactant treatment followed by an alcohol treatment and finally followed by an aqueous organic acid treatment. The former method may be used to clean a plasma etch residue from a dual damascene aperture. The second method may be used to clean a chemical mechanical polish planarizing residue from a dual damascene structure. The two methods may be used sequentially, absent any intervening or subsequent sputtering method, to provide a dual damascene structure within a microelectronic structure.

12 Claims, 5 Drawing Sheets

CLEANING PROCESS FOR MICROELECTRONIC DIELECTRIC AND METAL STRUCTURES

BACKGROUND

1. Field of the Invention

The invention relates generally to cleaning processes for microelectronic structures. More particularly, the invention relates to cleaning processes for microelectronic dielectric and metal structures.

2. Description of the Related Art

Microelectronic structures, and in particular semiconductor structures, are generally fabricated using successive layering processes that are intended to fabricate successive portions of a microelectronic structure over a microelectronic substrate, such as a semiconductor substrate. The fabrication of successive portions of a microelectronic structure over a microelectronic substrate may use any of several microelectronic fabrication processes. Non-limiting examples include ion implant processes, photolithographic processes, selective etch processes and selective deposition processes.

Common in the microelectronic fabrication art is the use of cleaning processes for cleaning microelectronic structures, such as semiconductor structures, at intermediate points in the fabrication of those microelectronic structures. Such cleaning processes are desirable insofar as such cleaning processes remove residues from microelectronic structure surfaces so that fully functional and reliable completed microelectronic structures may be fabricated from the residue laden partially completed microelectronic structures.

While effective and efficient cleaning processes are certainly desirable at any stage of microelectronic structure fabrication, effective and efficient cleaning processes are often particularly desirable within the context of microelectronic dielectric and metal structure fabrication, since ineffectively or inefficiently cleaned microelectronic dielectric and metal structures are often readily discernible through electrical measurements. Similarly, a particular dielectric and metal structure that may be desirably cleaned to provide a functional and reliable microelectronic structure is a dual damascene structure. A dual damascene structure includes a dual damascene aperture that in turn includes a via aperture contiguous with an overlying trench aperture within a dielectric layer. The dual damascene structure also includes a contiguous via and interconnect layer located and formed into the corresponding via aperture contiguous with the trench aperture within the dual damascene aperture.

Various cleaning processes having desirable properties are known for cleaning microelectronic structures within the microelectronic fabrication art.

For example, Nasher et al., in U.S. Pat. No. 6,465,358, teaches a method for cleaning a semiconductor structure that may include a dual damascene aperture. This particular method sequentially uses: (1) a buffered oxide etchant treatment; followed by (2) an amine based solution treatment.

In addition, Eissa et al., in U.S. Pat. No. 6,551,943, teaches a method for cleaning a microelectronic substrate that includes a dual damascene aperture located within an organic silicate glass material. The method uses a wet chemical etchant comprising hydrogen fluoride and hydrogen peroxide for cleaning a residue from within the dual damascene aperture while not etching the organic silicate glass material.

Further, Wu et al., in U.S. Pat. No. 6,554,002, teaches another method for cleaning a dual damascene aperture within a microelectronic structure. The method uses a solvent treatment, followed by a thermal annealing treatment and/or a sputtering treatment, for cleaning the dual damascene aperture.

Still further, Naghshineh et al., in U.S. Pat. No. 6,851,432, teaches a cleaning composition that may be used for cleaning a microelectronic structure. The cleaning composition includes an alkanolamine, a tetraalkylammonium hydroxide, a nonmetallic fluoride salt and a corrosion inhibitor.

Yet further, Peyne et al., in U.S. Pat. No. 7,157,415, teaches a post etch cleaning composition that is useful in cleaning dual damascene apertures within microelectronic structures. The cleaning composition includes in particular a choline material.

Finally, Wu et al., in U.S. Pat. No. 7,172,976, teaches yet another method for cleaning a dual damascene aperture within a microelectronic structure. The particular method uses a mild hydrogen peroxide oxidation and a subsequent etch to remove a copper oxide from a copper containing material exposed at the bottom of the dual damascene aperture, while simultaneously avoiding any copper reduction reactions involving the copper containing material.

The performance of dielectric and metal structures, such as but not limited to dual damascene structures, is likely to continue to be prominent as microelectronic technology, and in particular semiconductor technology, advances. To that end, desirable are cleaning methods and cleaning materials that efficiently assist in providing functional and reliable connections within dielectric and metal structures, such as dual damascene structures.

SUMMARY OF THE INVENTION

In a first instance, the invention provides a plurality of methods for cleaning a dielectric and metal structure within a microelectronic structure. A first particular method includes: (1) an oxygen plasma treatment of the dielectric and metal structure; followed by (2) an alcohol treatment of the dielectric and metal structure; followed by; (3) an aqueous organic acid treatment of the dielectric and metal structure. A second method includes: (1) an aqueous surfactant treatment of the dielectric and metal structure; followed by (2) an alcohol treatment of the dielectric and metal structure; followed by; (3) an aqueous organic acid treatment of the dielectric and metal structure. The first method is useful in cleaning a plasma etch residue from the dielectric and metal structure, which preferably comprises a dual damascene aperture. The second method is useful in cleaning a chemical mechanical polish planarizing residue from the dielectric and metal structure, which preferably comprises a contiguous via and interconnect layer located and planarized within the dual damascene aperture to provide a dual damascene structure.

A method for treating and cleaning a dielectric and metal structure within a microelectronic structure in accordance with the invention includes treating a dielectric and metal structure with an oxygen plasma to form a once treated dielectric and metal structure. The method also includes treating the once treated dielectric and metal structure with an alcohol to form a twice treated dielectric and metal structure. The method also includes treating the twice treated dielectric and metal structure with an aqueous organic acid to form a thrice treated dielectric and metal structure.

Another method for treating and cleaning a dielectric and metal structure within a microelectronic structure in accordance with the invention includes treating the dielectric and metal layer with an aqueous surfactant to form a once treated dielectric and metal structure. This particular method also includes treating the once treated dielectric and metal structure with an alcohol to form a twice treated dielectric and metal structure. This particular method also includes treating the twice treated dielectric and metal structure with an aqueous organic acid to form a thrice treated dielectric and metal structure.

A method for fabricating a dual damascene structure in accordance with the invention includes forming, while using a plasma etch method, a dual damascene aperture through a dielectric layer located over a substrate to access a conductor contact layer located interposed between the substrate and the dielectric layer. This particular method also includes cleaning the dual damascene aperture by treatment with an oxygen plasma followed by treatment with an alcohol in turn followed by treatment with an aqueous organic acid. This particular method also includes forming a planarized contiguous via and interconnect layer into the cleaned dual damascene aperture. This particular method also includes cleaning the planarized contiguous via and interconnect layer by treatment with an aqueous surfactant followed by treatment with an alcohol, in turn followed by treatment with an aqueous organic acid.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure wherein.

DESCRIPTION OF THE PREFERRED EMBODIMENT

The invention, which provides: (1) a plurality of methods for cleaning a dielectric and metal structure within a microelectronic structure; as well as (2) a method for fabricating a dual damascene structure within a microelectronic structure, is understood within the context of the description set forth below. The description set forth below is understood within the context of the drawings described above. Since the drawings are intended for illustrative purposes, the drawings are not necessarily drawn to scale.

FIG. 1 to FIG. 10 shows a series of schematic cross-sectional diagrams illustrating the results of progressive stages in fabricating a semiconductor structure in accordance with a particular embodiment of the invention. This particular embodiment of the invention comprises a preferred embodiment of the invention.

While the preferred embodiment illustrates the invention within the context of a semiconductor structure, neither the embodiment, nor the invention, is necessarily intended to be so limited. Rather, the embodiment and the invention may also be practiced within the context of alternative microelectronic structures which need not necessarily be semiconductor structures. Such alternative microelectronic structures will typically use appropriate microelectronic substrates other than semiconductor substrates. Such microelectronic substrates other than semiconductor substrates may include, but are not necessarily limited to ceramic substrates, glass substrates and glass-ceramic substrates.

Figure 1:
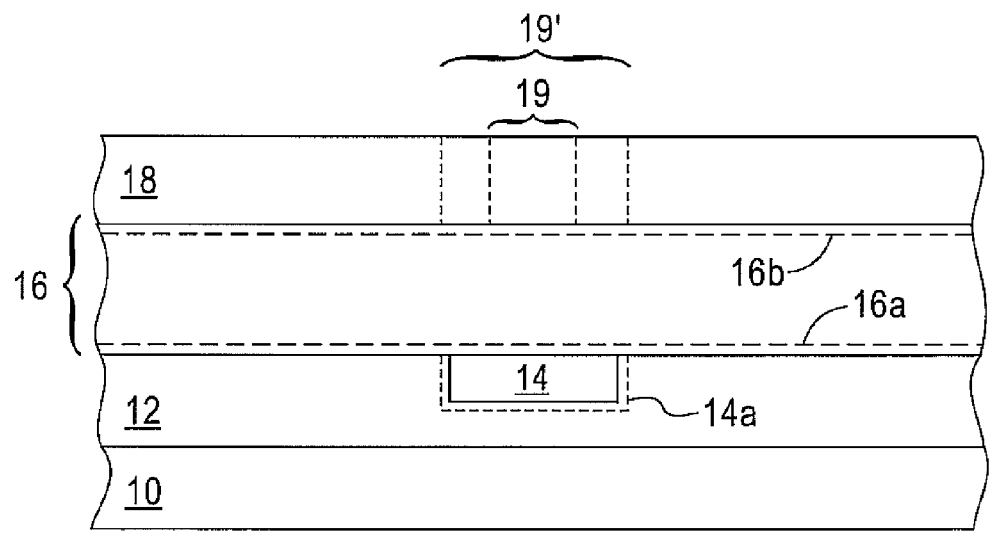
FIG. 1 to FIG. 10 show a series of schematic cross-sectional diagrams illustrating the results of progressive stages in fabricating a dual damascene structure within a semiconductor structure in accordance with a particular embodiment of the invention.

FIG. 1 shows a schematic cross-sectional diagram of the semiconductor structure in accordance with the embodiment at an early stage in the fabrication thereof in accordance with the embodiment.

FIG. 1 shows a semiconductor substrate 10 as a reference plane upon, over or above which other layers and structures are located and fabricated in accordance with the embodiment. In particular FIG. 1 also shows: (1) a first dielectric layer 12 located and formed upon the semiconductor substrate 10; (2) a conductor contact layer 14 located and formed embedded within the first dielectric layer 12; (3) a second dielectric layer 16 located and formed upon the first dielectric layer 12 and the conductor contact layer 14; and (4) a mask layer 18 located and formed upon the second dielectric layer 16.

Each of the foregoing semiconductor substrate 10 and overlying layers 12/14/16/18 may individually comprise materials, have dimensions and be formed using methods that are otherwise generally conventional in the semiconductor fabrication art.

The semiconductor substrate 10 comprises a semiconductor material. The semiconductor material may be selected from the group including but not limited to silicon, germanium, silicon-germanium alloy, silicon-carbon alloy, silicon-germanium-carbon alloy and compound (i.e., III-V and II-VI) semiconductor materials. Non-limiting examples of compound semiconductor materials further include gallium arsenide, indium arsenide and indium phosphide semiconductor materials.

While FIG. 1 illustrates the embodiment within the context of a semiconductor substrate 10 that implicitly comprises a bulk semiconductor substrate, neither the embodiment nor the invention is intended to be so limited. Rather, the embodiment and the invention alternatively contemplate the use of a semiconductor-on-insulator substrate or a hybrid orientation substrate for the semiconductor substrate 10.

A semiconductor-on-insulator substrate includes a buried dielectric layer interposed between a base semiconductor substrate portion of a semiconductor substrate and a surface semiconductor layer portion of the semiconductor substrate. The base semiconductor substrate and the surface semiconductor layer may be identical or different with respect to semiconductor material composition, crystallographic orientation, dopant polarity and dopant concentration. A hybrid orientation substrate includes multiple crystallographic orientation semiconductor regions supported upon a single semiconductor substrate. Semiconductor-on-insulator substrates and hybrid orientation substrates may be fabricated using methods that are conventional in the semiconductor fabrication art. Included in particular are ion implantation oxidation methods, layer transfer methods and layer lamination methods.

Although also not particularly illustrated within the schematic cross-sectional diagram of FIG. 1, the semiconductor substrate 10, regardless of whether the semiconductor substrate 10 comprises a bulk semiconductor substrate, a semiconductor-on-insulator substrate, a hybrid orientation substrate or an alternative semiconductor substrate, typically and preferable has microelectronic devices, such as semiconductor devices, located therein and/or thereupon. Such microelectronic devices may include, but are not necessarily limited to: (1) active semiconductor devices such as but not limited to diodes and transistors; as well as (2) passive devices which need not necessarily be semiconductor devices, such as but not limited to resistors and capacitors.

The first dielectric layer 12 and the second dielectric layer 16 may comprise any of several dielectric materials from which may, in general, be comprised pre-metal dielectric layers, inter-level dielectric layers and intra-level dielectric layers within semiconductor structures. Within the context of this particular passivating layer application illustrated in FIG. 1, the first dielectric layer 12 and the second dielectric layer 16 may comprise generally higher dielectric constant dielectric materials (i.e., having a dielectric constant from about 4 to about 20), such as but not limited to silicon oxide, silicon nitride and silicon oxynitride dielectric materials. Alternatively, and preferably, the first dielectric layer 12 and the second dielectric layer 16 may each individually also comprise a generally lower dielectric constant dielectric material (i.e., having a dielectric constant from about 2.5 to about 4) such as but not limited to a spin-on-glass dielectric material, a spin-on-polymer dielectric material, a micro-porous dielectric material, a nano-porous dielectric material, a carbon doped dielectric immaterial or a fluorine doped dielectric material. Also contemplated within the context of the instant embodiment are laminates and composites of any of the foregoing dielectric materials. The foregoing dielectric materials may be fabricated using methods that are generally conventional in the semiconductor fabrication art. Non-limiting examples include spin-on methods, chemical vapor deposition methods and physical vapor deposition methods. Typically, each of the first dielectric layer 12 and the second dielectric layer 16 comprises at least in part a generally lower dielectric constant dielectric material as disclosed above. Typically, each of the first dielectric layer 12 and the second dielectric layer 16 has a thickness from about 500 to about 5000 angstroms.

As is illustrated in phantom in FIG. 1, the embodiment also contemplates the use of a lower capping layer 16a and an upper capping layer 16b as portions of the second dielectric layer 16. Although not specifically illustrated within the schematic cross-sectional diagram of FIG. 1, such additional component capping layers are also contemplated within the context of the first dielectric layer 12. The lower capping layer 16a and the upper capping layer 16b may function as diffusion barrier layers. Alternatively, at least the upper capping layer 16b may also function as a planarizing stop layer that has planarizing stop properties. Similarly with remaining portions of the second dielectric layer 16, each of the lower capping layer 16a and the upper capping layer 16b also comprises a dielectric material, but typically a carbide containing dielectric material or a nitride containing dielectric material that provides enhanced barrier properties and/or enhanced planarizing stop properties to the lower capping layer 16a and the upper capping layer 16b. The lower capping layer 16a and the upper capping layer 16b are omitted for clarity in subsequent drawing figures. Also omitted for clarity are any intervening etch stop layers within the second dielectric layer 16 that may assist in forming a dual damascene aperture within the second dielectric layer 16 incident to further processing of the semiconductor structure whose schematic cross-sectional diagram is illustrated in FIG. 1.

The conductor contact layer 14 comprises a conductor material. Candidate conductor contact materials from which may be comprised the conductor contact layer 14 include certain metals, metal alloys, metal nitrides and metal silicides that provide adequate performance for the conductor contact layer 14. Particularly desirable conductor materials include copper and copper alloy conductor materials, due to their electrical current carrying capacity. Other conductor materials, such as but not limited to titanium, tantalum, aluminum and tungsten conductor materials, are not excluded.

Also contemplated by the embodiment, and also desirable, are liner layers and barrier layers that separate the conductor contact layer 14 from the first dielectric layer 12. Such a liner layer or barrier layer is illustrated in phantom as reference numeral 14a. Liner layers and barrier layers that separate the conductor contact layer 14 from the first dielectric layer 12 are typically, but not necessarily, conductor liner layers and conductor barrier layers. Such conductor liner layers and conductor barrier layers typically include refractory metals and refractory metal nitrides such as but not limited to titanium, tantalum and tungsten, and the nitrides of titanium, tantalum and tungsten. As discussed above, capping layers such as liner layers and barrier layers that separate the conductor contact layer 14 from a bulk portion of the second dielectric layer 16 typically comprise dielectric materials which typically include a nitride material or a carbide material. The particular conductor materials from which may be comprised the conductor contact layer 14 may be formed using methods that are appropriate to their individual materials of composition. Non-limiting examples include plating methods, chemical vapor deposition methods and physical vapor deposition methods. Generally, the conductor contact layer 14 comprises a copper containing conductor material layer that has a generally conventional thickness.

The resist layer 18 comprises a resist material that within the context of further processing of the semiconductor structure whose schematic cross-sectional diagram is illustrated in FIG. 1 may include a photo resist material or an electron beam resist material. Such a resist material may be selected from the group including but not limited to positive resist materials, negative resist materials and hybrid resist materials that exhibit properties of both positive resist materials and negative resist materials. Typically and preferably, the resist layer 18 is located and formed upon the second dielectric layer 16 within the semiconductor structure of FIG. 1 while using generally conventional methods, which will typically include spin-coating methods. Typically, the resist layer 18 has a thickness from about 500 to about 2500 angstroms.

FIG. 1 finally shows a via exposure region 19 and a trench exposure region 19' within the resist layer 18. The via exposure region 19 and the trench exposure region 19' are intended for sequential exposures of the resist layer 18 when the resist layer 18 comprises a positive resist material. Under certain circumstances where the via exposure region 19 is exposed and developed within the resist layer 18 prior exposure of remaining portions of the trench exposure region 19' within the resist layer 18, a single positive resist layer 18 may be used for etching a dual damascene aperture within the second dielectric layer 16 within the semiconductor structure of FIG. 1. Alternatively, two separate resist layers of a positive resist material may also be used. Similarly, when the resist layer 18 comprises a negative resist material, a plurality of resist layers 18 is typically needed for further processing of the semiconductor structure whose schematic cross-sectional diagram is illustrated in FIG. 1 to form within the second dielectric layer 16 a dual damascene aperture in accordance with further processing that is discussed below.

Figure 2:
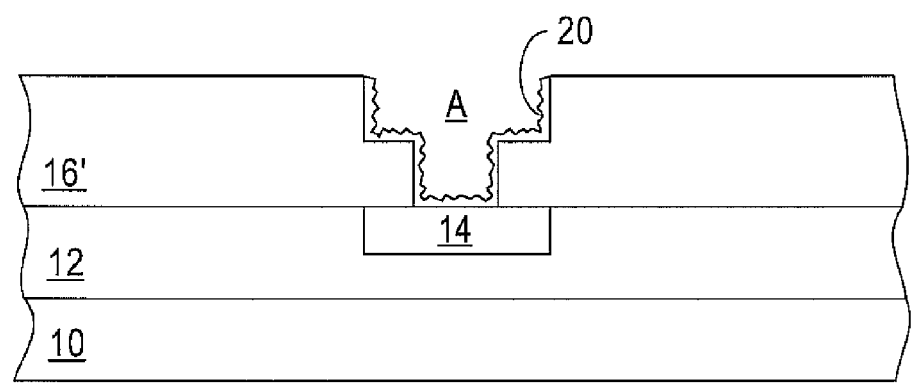

FIG. 2 shows the results of forming a dual damascene aperture A within the second dielectric layer 16 within the semiconductor structure of FIG. 1 to thus form a second dielectric layer 16'. The dual damascene aperture A is formed within the second dielectric layer 16' while using at least in part the resist layer 18 that is illustrated in FIG. 1 (i.e., when appropriately exposed and developed) as an etch mask. As is discussed above, under circumstances where the resist layer 18 comprises a positive resist material, a sequential exposure and development of the resist layer 18 using the via exposure region 19, and then the trench exposure region 19', may provide adequate definition for sequentially etching first a lower lying via portion of the dual damascene aperture A into the second dielectric layer 16' and then a contiguous upper lying trench portion of the dual damascene aperture A into the second dielectric layer 16'.

This particular embodiment does not discriminate with respect to forming a trench first, or alternatively forming a via first, when forming the dual damascene aperture A within the second dielectric layer 16' within the semiconductor structure of FIG. 2. Under certain circumstances, in order to provide enhanced dimensional control, a trench first approach for forming a dual damascene aperture may be desirable. Under any circumstances, however, the conductor contact layer 14 will eventually be exposed at the base of the via portion of the dual damascene aperture A, as is illustrated in FIG. 2.

FIG. 2 also shows a residue 20 located and formed lining the dual damascene aperture A including the conductor contact layer 14 and the second dielectric layer 16'. The residue 20 derives from resist material residues, etchant gas material residues and conductor contact layer material residues when etching the dual damascene aperture A within the second dielectric layer 16' to expose a portion of the conductor contact layer 14 within the dual damascene aperture A. Thus, the residue 20 typically comprises a hydrocarbon component that derives from minor sputtering and etching of the resist material that comprises the resist layer 18 that is illustrated in FIG. 1. The residue 20 also typically comprises a fluorocarbon component that derives from a fluorine containing etchant gas composition that is used for etching the second dielectric layer 16 that is illustrated in FIG. 1 to provide the dual damascene aperture A within the second dielectric layer 16' that is illustrated in FIG. 2. The residue 20 finally also typically comprises a metal residue and/or a metal oxide residue that derives from the metal material from which is comprised the conductor contact layer 14. As is understood by a person skilled in the art, a residue within a dual damascene aperture, such as the residue 20 within the dual damascene aperture A within the semiconductor structure whose schematic cross-sectional diagram is illustrated in FIG. 2, is often difficult to efficiently and effectively remove. Such a difficulty in removal often derives from the presence of multiple components within the residue 20, some of which components may become more difficult to remove when attempting to remove other of the components.

The embodiment and the invention are thus in-part directed towards providing a method for efficiently and effectively removing the residue 20 from the dual damascene aperture A within the semiconductor structure whose schematic cross-sectional diagram is illustrated in FIG. 2, absent damage to the dual damascene aperture A that is defined by the second dielectric layer 16' and the conductor contact layer 14.

Figure 3:
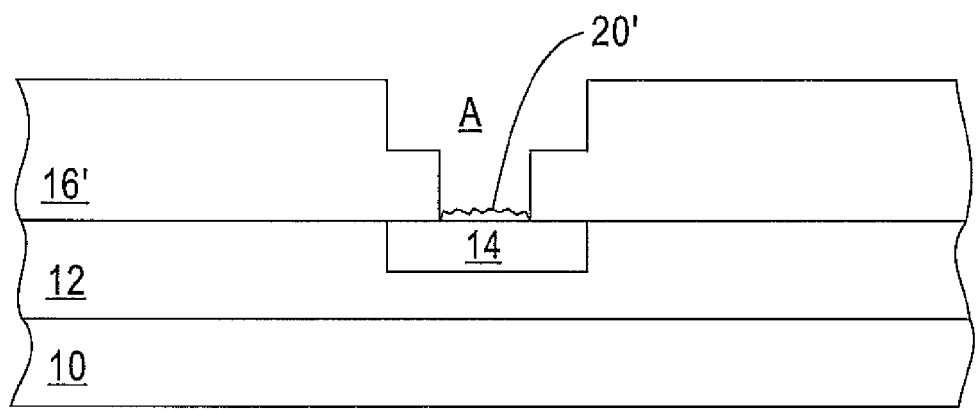

FIG. 3 shows the results of removing part of the residue 20 from the dual damascene aperture A as is illustrated in FIG. 2 to provide a residue 20' within the dual damascene aperture A. Within the embodiment, the portion of the residue 20 that is removed when forming the residue 20' is removed using an oxygen containing plasma treatment of the semiconductor structure of FIG. 2 followed by an alcohol treatment of the semiconductor structure of FIG. 2.

The oxygen containing plasma treatment uses a comparatively low concentration oxygen containing plasma treatment of the semiconductor structure of FIG. 2. The oxygen containing plasma treatment typically uses molecular oxygen (i.e., diatomic oxygen) plasma treatment. Other oxygen containing species may be used, including but not limited to ozone, nitrous oxide and nitric oxide. Particular process conditions include: (1) a reactor chamber pressure from about 30 to about 300 millitorr; (2) radio frequency power from about 50 to about 300 watts; (3) an oxygen flow rate from about 30 to about 100 standard cubic centimeters per minute (sccm); and (4) an oxygen containing plasma treatment time from about 10 to about 100 seconds. The foregoing process conditions will typically provide a photoresist removal rate from about 10 to about 50 angstroms per second in an otherwise generally conventional 200 mm plasma stripping apparatus.

In general, reactive ion etch residues that result from etching interlevel dielectric layers include fluorine, hydrogen and nitrogen components. These components have a tendency to form a hydrophobic residue. For this reason, the foregoing low power oxygen containing reactive ion etch will typically convert the surfaces of vias and the residues into more hydrophilic surfaces absent oxidation of copper.

The alcohol treatment may be a pure alcohol treatment, or alternatively the alcohol treatment may use an aqueous alcohol solution comprising at least about 5 weight percent alcohol, and more preferably from about 50 to about 100 weight percent alcohol. Candidate alcohols for the alcohol treatment include, but are not limited to, linear and branched chain alcohols having up to four carbon atoms. Preferred alcohols include methanol, ethanol, normal propanol and iso-propanol. Particularly preferred is pure iso-propanol. Within the embodiment, it is intended that the alcohol within the alcohol treatment is selected primarily to remove hydrocarbon portions and fluorocarbon portions of the residue 20 that is illustrated in FIG. 2 when forming when forming the residue 20' that is illustrated in FIG. 3. Typically and preferably, the alcohol treatment of the semiconductor structure of FIG. 2 to provide the semiconductor structure of FIG. 3 uses a pure (or substantially pure) iso-propanol treatment by immersion at a temperature from about 25 to about 50 degrees centigrade for a time period from about 1 to about 5 minutes.

Figure 4:
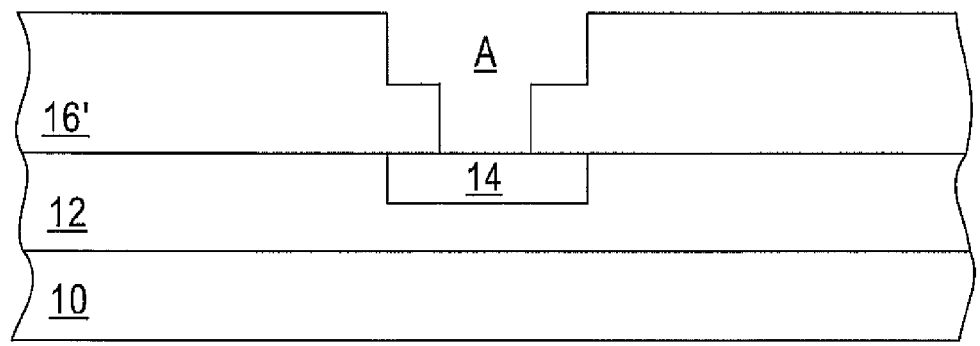

FIG. 4 shows the results of removing the residue 20' from the semiconductor structure of FIG. 3 to provide a semiconductor structure having a dual damascene aperture A absent any residue therein. Within the embodiment, the residue 20' that is illustrated in FIG. 3, which comprises primarily a metal residue and/or a metal oxide residue, is removed from the semiconductor structure whose schematic cross-sectional diagram is illustrated in FIG. 3 to provide the semiconductor structure whose schematic cross-sectional diagram is illustrated in FIG. 4 while using an aqueous organic acid treatment of the semiconductor structure whose schematic cross-sectional diagram is illustrated in FIG. 3. Candidate organic acids include linear and branched chain organic acids having up to five carbon atoms. A particularly desirable organic acid is acetic acid, although neither the embodiment nor the invention is so limited. In addition, the aqueous organic acid that is used to remove the residue 20' within the semiconductor structure of FIG. 3 to provide the semiconductor structure of FIG. 4 is used at a generally reduced dilute concentration at less than about 0.3 weight percent and more typically from about 0.1 to about 0.5 weight percent. Such a low concentration of the organic acid provides for effective removal of metal and/or metal oxide residues while avoiding undesirable corrosion of the conductor contact layer 14, particularly when the conductor contact layer 14 comprises copper. Typically, the semiconductor structure whose schematic cross-sectional diagram is illustrated in FIG. 3 is treated with a dilute 0.28 weight percent acetic acid solution at a temperature from about 22 to about 25 degrees centigrade for a time period from about 1 to about 2 minutes to provide the semiconductor structure whose schematic cross-sectional diagram is illustrated in FIG. 4.

Figure 5:
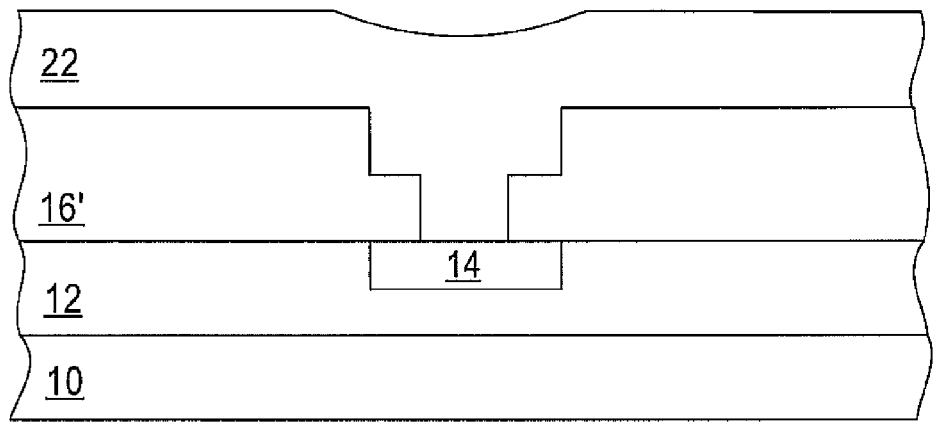

FIG. 5 shows a second conductor layer 22 located and formed covering the semiconductor structure of FIG. 4, and filling the dual damascene aperture A. Similarly with the conductor contact layer 14, the second conductor layer 22 may also comprise any of several conductor materials. Again, particular candidate conductor materials include, but are not limited to, certain metals, metal alloys, metal nitrides and metal silicides. Also similarly with the conductor contact layer 14, the second conductor layer 22 typically comprises a copper or a copper alloy conductor material that may be formed using any of the several methods that are disclosed above for forming the conductor contact layer 14. Finally, also optional but typically included when forming the second conductor layer 22 into the dual damascene aperture A is a barrier layer that is not otherwise shown, but is intended to correlate with the barrier layer 14a that is illustrated in FIG. 1.

Typically the semiconductor structure of FIG. 5 includes a conductor barrier layer as a liner layer that lines the dual damascene aperture A prior to locating and forming a bulk portion of the second conductor layer 22 thereupon. Similarly with the conductor barrier layer 14a within FIG. 1, the conductor barrier layer comprises a titanium sub-liner material that has a thickness from about 10 to about 60 angstroms in turn having a titanium nitride subliner having a thickness from about 10 to about 60 angstroms. Typically, a bulk portion of the second conductor layer 22 comprises a copper conductor material or a copper containing conductor material.

Figure 6:
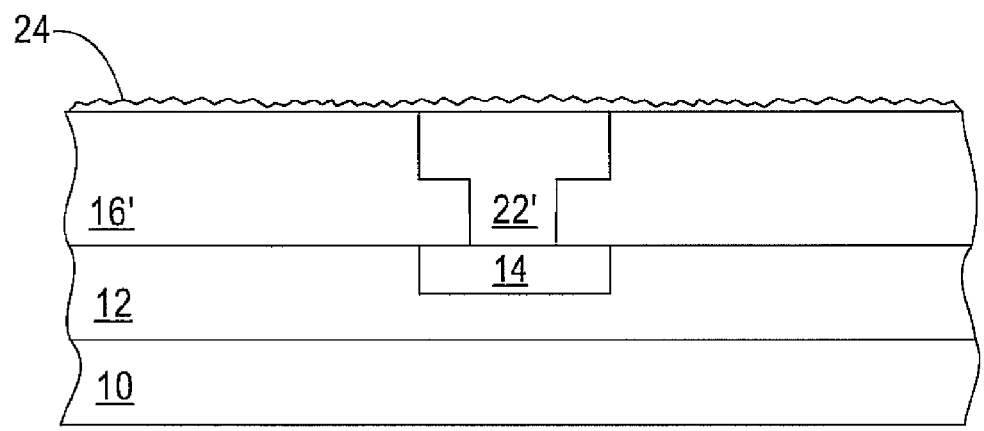

FIG. 6 shows a contiguous via and interconnect layer 22' located and formed within the dual damascene aperture A. The contiguous via and interconnect layer 22' results from planarizing the second conductor layer 22 that is illustrated in FIG. 5 into the dual damascene aperture A at the level of the second dielectric layer 16'. The foregoing planarization may be effected using planarizing methods and materials that are otherwise generally conventional in the semiconductor fabrication art. Non-limiting examples of such planarizing methods include mechanical planarizing methods and chemical mechanical polish planarizing methods. Chemical mechanical polish planarizing methods are particularly common.

As is also illustrated within the schematic cross-sectional diagram of FIG. 6, a second residue 24 is typically located and formed upon the second dielectric layer 16' and the contiguous via and interconnect 22' incident to the planarization process that is used for forming the contiguous via and interconnect 22' from the second conductor layer 22. The second residue 24 differs from the residue 20 that is illustrated in FIG. 2 insofar as the second residue 24 comprises at least in part a planarizing slurry residue that is unlikely to include an organic component that derives from a resist material or a fluorocarbon component that derives from an etchant gas composition. However, an organic component within the second residue 24 may include a planarizing pad residue. Also included within the second residue 24 are metal and/or metal oxide residues from the second conductor layer 22 which may relate and correlate with metal and/or metal oxide residues within the residue 20 that is illustrated in FIG. 2.

Figure 7:
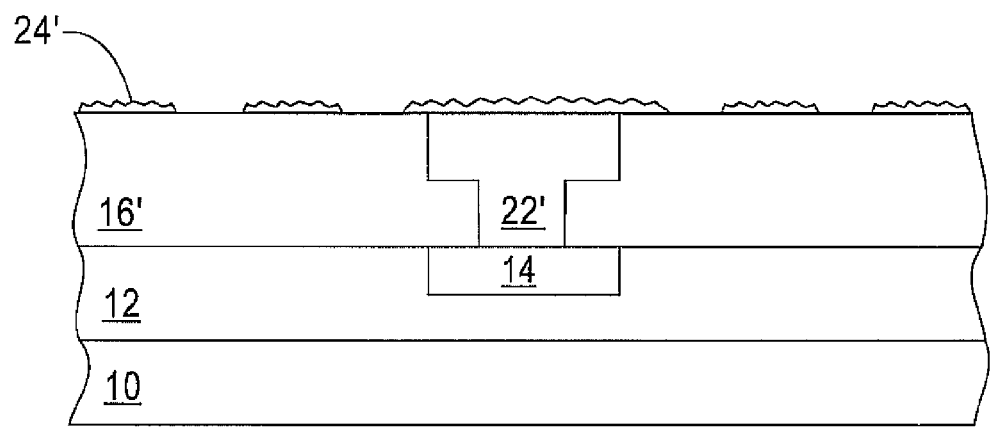

FIG. 7 shows a second residue 24' that is formed incident to partial removal of the second residue 24 that is illustrated in FIG. 6. Within the embodiment, partial removal of the second residue 24 to form the second residue 24' is effected using an aqueous surfactant solution that is intended to remove a planarizing slurry residue component from the second residue 24'. Particular surfactants that may be used in the aqueous surfactant solution include anionic, cationic and non-ionic surfactants. Anionic surfactants and cationic surfactants are particularly desirable insofar as anionic surfactants and cationic surfactants will further compliment additional cleaning treatment processing that follows. Non-limiting examples of particular surfactants that may be used include Microclean™ by Amity International and LiquiNox® by Alconox surfactants. The aqueous surfactant solution that is used for treating the residue 24 within the semiconductor structure whose schematic cross-sectional diagram is illustrated in FIG. 6 to provide the residue 24' within the semiconductor structure of FIG. 7 typically and preferably uses a LiquiNox® or a Microclean™ surfactant at a concentration from about 0.1 to about 0.5 weight percent and a temperature from about 22 to about 30 degrees centigrade, for a time period sufficiently suitable to remove a portion of the residue 24 that is illustrated in FIG. 6 to provide the residue 24' that is illustrated in FIG. 7. Time periods in a range from about 1 to about 3 minutes with proper agitation are common.

Figure 8:
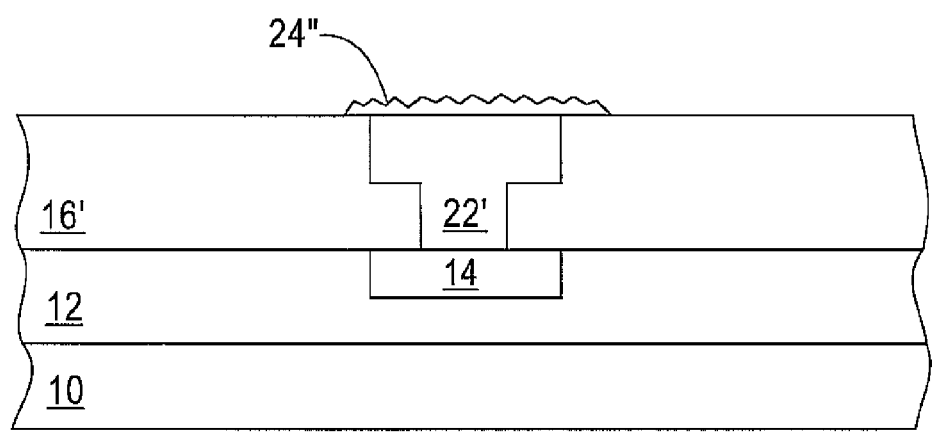

FIG. 8 shows a second residue 24" that results from additional removal of an additional portion of the second residue 24' that is illustrated in FIG. 7. The additional removal of the additional portion of the second residue 24' to form the second residue 24" is effected using an alcohol treatment of the semiconductor structure of FIG. 7. The alcohol treatment is otherwise analogous, equivalent or identical, within the context of an alcohol component, concentration and treatment parameters, to the alcohol treatment of the semiconductor structure of FIG. 2 to provide the semiconductor structure of FIG. 3. Within the context of the semiconductor structure whose schematic cross-sectional diagrams are illustrated in FIG. 6 to FIG. 9, the alcohol treatment is intended to remove organic residues that may result from a chemical mechanical polishing pad residue.

Figure 9:
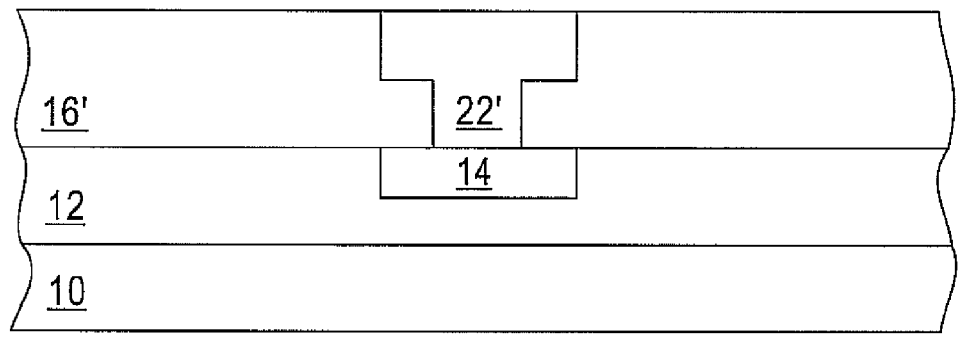

FIG. 9 shows the results of further treatment of the semiconductor structure of FIG. 8 to remove the second residue 24". The further treatment of the semiconductor structure whose schematic cross-sectional diagram is illustrated in FIG. 8 to remove the second residue 24" is effected using an aqueous organic acid treatment that is otherwise analogous, equivalent or identical to the aqueous organic acid treatment that is used for removing the reside 20' from the semiconductor structure that is illustrated in FIG. 3 to provide the semiconductor structure that is illustrated in FIG. 4.

Figure 10:
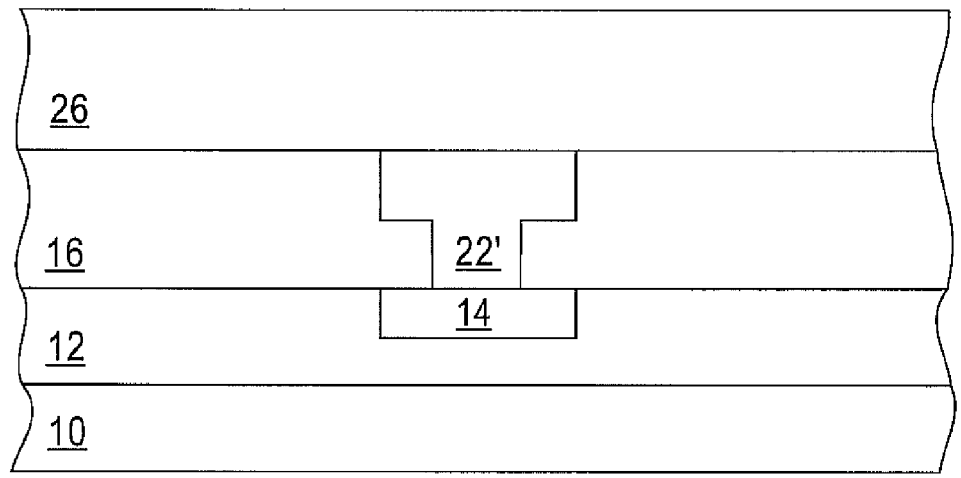

FIG. 10 shows a third dielectric layer 26 located and formed upon the semiconductor structure of FIG. 9. Similarly with the second dielectric layer 16 that is illustrated in FIG. 1, the third dielectric layer 26 may optionally include a lower capping layer and an upper capping layer that are not specifically illustrated. The third dielectric layer 26 and the related capping layers, if present, may comprise materials, have dimensions and be formed using methods otherwise analogous, equivalent or identical to the materials, dimensions and methods used for forming the second dielectric layer 16 (including the capping layers 16a and 16b) that are illustrated within the schematic cross-sectional diagram of FIG. 1.

FIG. 10 shows a schematic cross-sectional diagram of a semiconductor structure in accordance with a preferred embodiment of the invention. The semiconductor structure includes a dual damascene structure that includes a contiguous via and interconnect 22' located and formed into a dual damascene aperture within a dielectric layer 16'. When fabricating this particular semiconductor structure in accordance with the preferred embodiment, the dual damascene aperture is cleaned after the dual damascene aperture is formed to remove an etch residue located therein. Such an etch residue is anticipated to include a hydrocarbon component, a fluorocarbon component and a metal and/or metal oxide component. The particular etch residue is cleaned using an oxygen plasma treatment followed by an alcohol treatment, in turn followed by an aqueous organic acid treatment. After the etch residue is cleaned from the dual damascene aperture, the contiguous via and interconnect 22' is located and formed into the dual damascene aperture. Since the etch residue has been removed while using the oxygen plasma treatment followed by the alcohol treatment, in turn followed by the aqueous organic acid treatment, the contiguous via and interconnect 22' within the dual damascene aperture makes a functional and reliable connection to a conductor contact layer 14 exposed within the dual damascene aperture. Thus, this particular embodiment contemplates no need for sputtering the conductor contact layer 14 within the dual damascene aperture prior to forming the contiguous via and interconnect 22' therein.

Subsequent to locating and planarizing the contiguous via and interconnect 22' into the dual damascene aperture, a planarizing residue, such as a chemical mechanical polish planarizing residue, is also removed from the surface of the contiguous via and interconnect 22', as well as the surrounding second dielectric layer 16. Removal of this second residue is effected while using an aqueous surfactant treatment, followed by an alcohol treatment, and finally followed by an aqueous organic acid treatment. The foregoing removal of the planarizing residue allows for functional and reliable fabrication of the semiconductor structure of FIG. 10, also absent any sputtering of the contiguous via and interconnect 22'.

The preferred embodiment is illustrative of the invention rather than limiting of the invention. Revisions and modifications may be made to methods, materials, structures and dimensions of a semiconductor structure in accordance with the preferred embodiment while still providing a method for fabricating a microelectronic structure in accordance with the invention, further in accordance with the accompanying claims.

What is claimed is:

1. A method for treating a microelectronic structure comprising:
    forming an opening in a dielectric layer using a photolithography process that includes a photoresist layer, wherein the opening in the dielectric layer exposes a surface of an underlying metal structure and wherein the photolithography process produces an etch residue present on surfaces of the opening which comprises a hydrophobic hydrocarbon component and a metallic-containing component;
    treating the surfaces of the opening with an oxygen containing plasma under conditions in which a removal rate of said etch residue is about 10 to about 50 angstroms per minute and wherein said treating converts said hydrophobic hydrocarbon component into a hydrophilic hydrocarbon component;
    removing said hydrophilic hydrocarbon component of the etch residue from the surfaces of the opening by treating the surfaces of the opening with an alcohol; and
    removing said metallic-containing component of the etch residue from the surfaces of the opening by treating the surfaces of the opening with an aqueous organic acid.

2. The method of claim 1, wherein the opening in the dielectric layer comprises a dual damascene aperture.

3. The method of claim 1, wherein the underlying metal structure is a copper containing metal layer.

4. The method of claim 1, wherein the organic acid is selected from the group consisting of linear and branched organic acids having up to five carbon atoms.

5. The method of claim 1, wherein the alcohol is isopropanol and the organic acid is acetic acid.

6. The method of claim 1, further comprising forming a metal layer within the opening in the dielectric layer.

7. The method of claim 1, wherein the etch residue further comprises a hydrophobic fluorocarbon component.

8. The method of claim 1, wherein the metallic-containing component of the etch residue comprises at least one of a metal and a metal oxide.

9. The method of claim 1, wherein said oxygen containing plasma comprises molecular oxygen.

10. The method of claim 1, wherein said oxygen containing plasma comprises an oxygen containing species selected from the group consisting of ozone, nitrous oxide and nitric oxide.

11. The method of claim 1, wherein said treating with said oxygen containing plasma is performed at a reactor chamber pressure from about 30 to about 300 millitorr, a radio frequency power from about 50 to about 300 watts, an oxygen flow rate from about 30 to about 100 standard cubic centimeters per minute (sccm), and an oxygen containing plasma treatment time from about 10 to about 100 seconds.

12. The method of claim 1, wherein the aqueous organic acid has a concentration less than 0.3 wt%.

* * * * *